(12) United States Patent
Han et al.

(10) Patent No.: US 7,630,259 B1
(45) Date of Patent: Dec. 8, 2009

(54) PROGRAMMABLE LOGIC DEVICE WITH BUILT IN SELF TEST

(75) Inventors: Wei Han, Beaverton, OR (US); Yoshita Yerramilli, Folsom, CA (US); Loren McLaury, Hillsboro, OR (US); Warren Juenemann, Cornelius, OR (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 76 days.

(21) Appl. No.: 11/959,329

(22) Filed: Dec. 18, 2007

(51) Int. Cl.
*G11C 29/00* (2006.01)
(52) U.S. Cl. .................................. 365/201; 365/189.04
(58) Field of Classification Search .................. 365/240
See application file for complete search history.

(56) References Cited

U.S. PATENT DOCUMENTS

| | | | | |
|---|---|---|---|---|
| 4,744,061 A * | 5/1988 | Takemae et al. | ............ | 365/201 |
| 5,663,965 A | 9/1997 | Seymour | | |
| 5,946,245 A * | 8/1999 | Brown et al. | ................. | 365/201 |
| 5,946,247 A * | 8/1999 | Osawa et al. | ................. | 365/201 |
| 6,094,388 A * | 7/2000 | Cowles | ......................... | 365/201 |
| 6,158,036 A * | 12/2000 | Kwak | ......................... | 714/733 |
| 6,687,867 B2 | 2/2004 | Ni | | |
| 7,103,814 B2 | 9/2006 | Corbin et al. | | |
| 2002/0024868 A1* | 2/2002 | Tsuboi et al. | ................ | 365/226 |
| 2003/0016578 A1* | 1/2003 | Janik et al. | ................... | 365/201 |
| 2006/0059386 A1 | 3/2006 | Han et al. | | |

* cited by examiner

*Primary Examiner*—Tan T. Nguyen
(74) *Attorney, Agent, or Firm*—Haynes and Boone, LLP (57) ABSTRACT

Various techniques are described to test memory arrays of a programmable logic device (PLD). In one example, a PLD includes a first memory array. The PLD also includes a plurality of sense amplifiers adapted to read a plurality of data values stored by the first memory array and provide a plurality of data signals corresponding to the data values. The PLD further includes a test circuit adapted to test the first memory array. The test circuit is coupled with the sense amplifiers and adapted to compare the data signals with a test signal to provide a pass/fail signal. In addition, the PLD includes a second memory array. The PLD also includes a data shift register adapted to test the second memory array.

18 Claims, 4 Drawing Sheets

PROGRAMMABLE LOGIC DEVICE WITH BUILT IN SELF TEST

TECHNICAL FIELD

The present invention relates generally to integrated circuits such as programmable logic devices and, more particularly, to the testing of programmable logic devices.

BACKGROUND

Programmable logic devices (PLDs), such as field programmable gate arrays (FPGAs) or complex programmable logic devices (CPLDs), may be configured to provide user-defined features. PLDs are often implemented with multiple memory arrays to store data, such as configuration data, user data, or other data.

During the manufacture of such PLDs, each memory array is typically tested to confirm proper operation. For example, test data values may be programmed into a memory array of a PLD. Data values stored by the memory array may then be read out from the memory array and compared to the original test data values. In this regard, data values stored by the memory array may be provided to a data shift register (DSR) which shifts the stored data values to appropriate testing logic to determine whether the stored data values corresponds to the original test data values programmed into the memory array.

Because the DSR is generally shared between the various memory arrays, testing is typically performed only on one memory array at a time. For example, in a PLD having separate non-volatile and volatile memory arrays, the non-volatile memory array (e.g., a flash memory array) is generally tested separately from the volatile memory array (e.g., a static random access memory (SRAM) array). As a result, the testing time associated with multiple memories is a significant portion of the overall PLD testing time, especially in cases where read margin tests are performed using different read reference voltages. Although certain PLDs may allow simultaneous execution of multiple memory instructions during testing, such implementations may still cause contention due to the use of a shared DSR.

Accordingly, there is a need for an improved approach to PLD testing. In particular, there is a need for an approach that reduces testing time without unduly increasing the size and complexity of PLD test circuitry.

SUMMARY

In accordance with one embodiment of the present invention, a programmable logic device (PLD) includes a first memory array; a plurality of sense amplifiers adapted to read a plurality of data values stored by the first memory array and provide a plurality of data signals corresponding to the data values; a test circuit adapted to test the first memory array, wherein the test circuit is coupled with the sense amplifiers and adapted to compare the data signals with a test signal to provide a pass/fail signal; a second memory array; and a data shift register adapted to test the second memory array.

In accordance with another embodiment of the present invention, a method includes performing a first test on a first memory array of a programmable logic device (PLD), wherein the first test comprises: reading a plurality of data values stored by the first memory array, providing a plurality of data signals corresponding to the data values, comparing the data signals with a test signal, and providing a pass/fail signal in response to the comparing; and performing a second test on a second memory array of the PLD using a data shift register of the PLD during the first test.

In accordance with another embodiment of the present invention, an integrated circuit includes a first memory array; a built in self test (BIST) test circuit adapted to test the first memory array; a second memory array; and a second test circuit adapted to test the second memory array simultaneously with the first test circuit testing the first memory array.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

In accordance with various embodiments further set forth herein, a programmable logic device (PLD) may be implemented to perform a built in self test process to facilitate simultaneous testing of multiple memory arrays of the PLD. In one embodiment, a non-volatile memory array (e.g., flash memory) and a volatile memory array (e.g., static random access memory (SRAM)) may be tested simultaneously. For example, margin bulk program and margin bulk erase tests may be performed on the non-volatile memory array using a testing circuit further described herein, while a data shift register (DSR) is used to simultaneously test the volatile memory array. As a result, manufacturing time associated with memory array testing can be significantly reduced.

Figure 1:
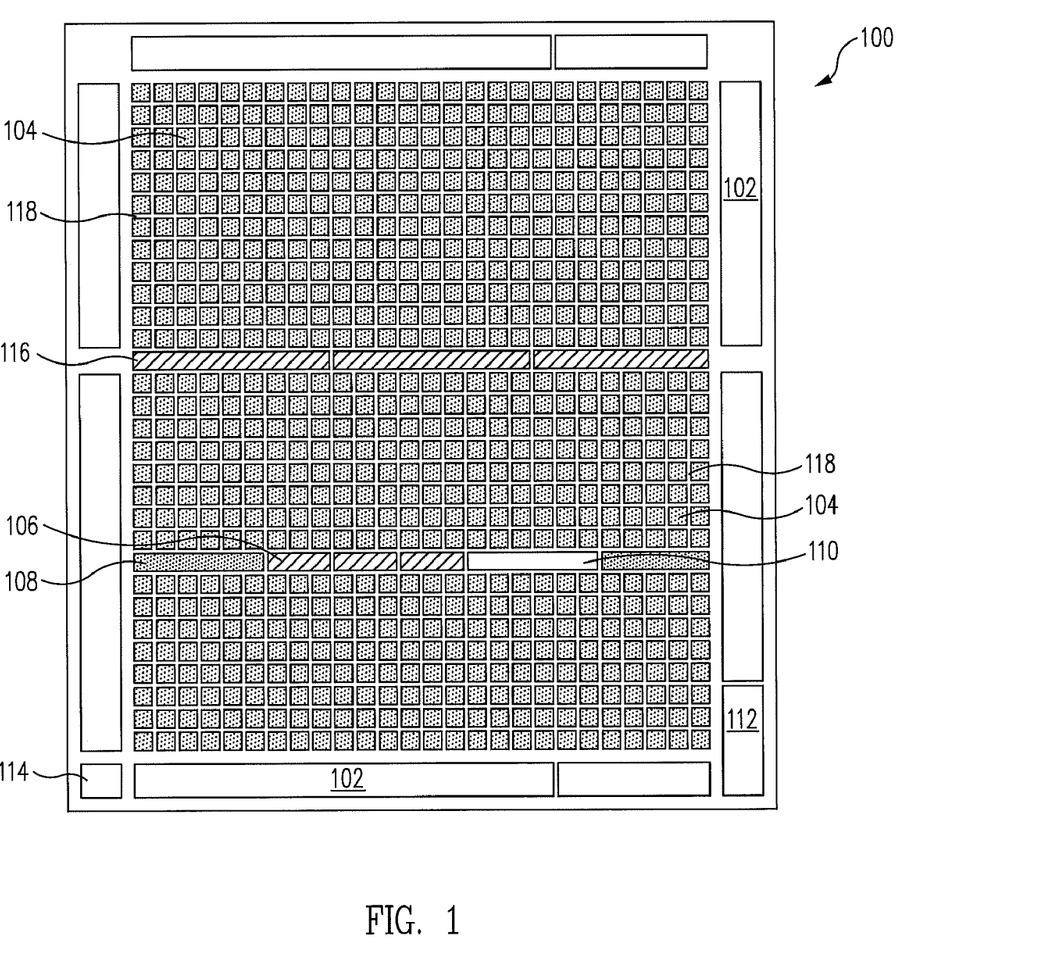
FIG. 1 illustrates a block diagram of a programmable logic device (PLD) in accordance with an embodiment of the invention.

FIG. 1 illustrates a block diagram of a programmable logic device (PLD) 100 in accordance with an embodiment of the invention. PLD 100 (e.g., a field programmable gate array (FPGA), a complex programmable logic device (CPLD), a field programmable system on a chip (FPSC), or other type of programmable device) generally includes input/output (I/O) blocks 102 and logic blocks 104 (e.g., also referred to as programmable logic blocks (PLBs), programmable functional units (PFUs), or programmable logic cells (PLCs)). I/O blocks 102 provide I/O functionality (e.g., to support one or more I/O and/or memory interface standards) for PLD 100, while programmable logic blocks 104 provide logic functionality (e.g., LUT-based logic or logic gate array-based logic) for PLD 100.

PLD 100 may also include blocks of memory 106 (e.g., blocks of EEPROM, block SRAM, and/or flash memory), clock-related circuitry 108 (e.g., PLL and/or DLL circuits), configuration logic 110 (e.g., for startup, decryption, encryption, multiple-boot support (e.g., dual boot support), and/or error detection), a configuration port 112, configuration memory 114, special function blocks 116 (e.g., digital signal processing (DSP) blocks or other forms of multiply and accumulate circuit functionality), and/or routing resources 118. In general, the various elements of PLD 100 may be used to perform their intended functions for the desired application, as would be understood by one skilled in the art.

For example, configuration port 112 may be used for programming PLD 100, such as memory 106 and/or configuration memory 114 or transferring information (e.g., various types of data and/or control signals) to/from PLD 100 as would be understood by one skilled in the art. For example, configuration port 112 may include a first programming port (which may represent a central processing unit (CPU) port, a peripheral data port, a serial peripheral interface, and/or a sysCONFIG programming port) and/or a second programming port such as a joint test action group (JTAG) port (e.g., by employing standards such as Institute of Electrical and Electronics Engineers (IEEE) 1149.1 or 1532 standards). Configuration port 112 typically, for example, may be included to receive configuration data and commands to support serial or parallel device configuration and information transfer.

It should be understood that the number and placement of the various elements, such as I/O blocks 102, logic blocks 104, memory 106, clock-related circuitry 108, configuration logic 110, configuration port 112, configuration memory 114, special function blocks 116, and routing resources 118, are not limiting and may depend upon the desired application. For example, special function blocks 116 are optional and various other elements may not be required for a desired application or design specification (e.g., for the type of programmable device selected).

Furthermore, it should be understood that the elements are illustrated in block form for clarity and that certain elements, such as for example configuration memory 114 or routing resources 118, would typically be distributed throughout PLD 100, such as in and between logic blocks 104, to perform their conventional functions (e.g., storing configuration data that configures PLD 100 or providing interconnect structure within PLD 100, respectively). It should also be understood that the various embodiments of the present invention as disclosed herein are not limited to programmable logic devices, such as PLD 100, and may be applied to various other types of programmable devices, as would be understood by one skilled in the art.

Figure 2:
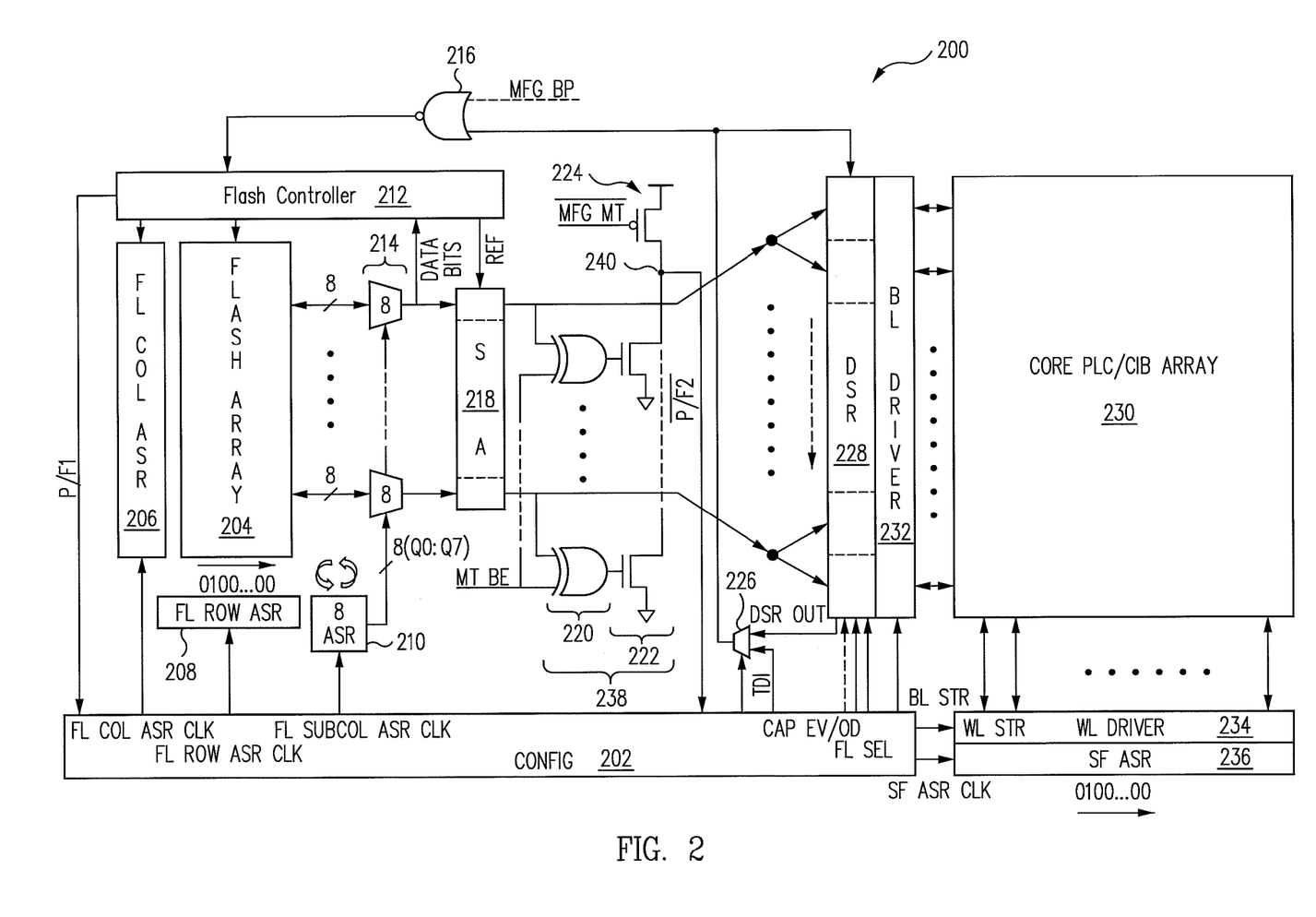
FIG. 2 illustrates a block diagram of a PLD implemented to perform a built in self test in accordance with an embodiment of the invention.

FIG. 2 illustrates a block diagram of a PLD 200 implemented to perform a built in self test in accordance with an embodiment of the invention. In particular, FIG. 2 illustrates a non-volatile memory array 204, a volatile memory array 230, a data shift register (DSR) 228, configuration logic 202, a test circuit 238, and other components further described herein. In one embodiment, the various components shown in FIG. 2 may be provided as part of PLD 100 of FIG. 1.

Non-volatile memory array 204 may be implemented, for example, as a flash memory array with a plurality of columns and rows that are selectable by a column address shift register (ASR) 206 and a row ASR 208, respectively, in response to control signals provided by configuration logic 202. A memory controller 212 may be used to provide non-volatile memory array 204 with data values to be programmed into non-volatile memory array 204 that are received from logic 216. Data values stored by non-volatile memory array 204 may be read by memory controller 212 and/or by a plurality of sense amplifiers 218 that receive the stored data values through a plurality of multiplexers 214 which are under the control of an ASR 210. As shown in FIG. 2, data values read by sense amplifiers 218 may be provided to DSR 232 and also to test circuit 238 through appropriate data signals.

As also shown in FIG. 2, memory controller 212 may control a reference voltage signal REF used by sense amplifiers 218 to read data values from non-volatile memory array 204. In one embodiment, memory controller 212 may adjust reference voltage signal REF to sweep through a plurality of reference voltages. Sense amplifiers 218 may compare these reference voltages with voltages received from non-volatile memory array 204 during margin bulk program and margin bulk erase tests when determining data values stored by non-volatile memory array 204.

Volatile memory array 230 may be implemented, for example, as SPAM. A bitline driver circuit 232, a wordline driver circuit 234, and an ASR 236 may be used to program volatile memory array 230 with data values stored in DSR 228, and also to read data values from volatile memory array 230 into DSR 228.

During runtime operation of PLD 200, a multiplexer 226 receives a signal DSR OUT corresponding to data values shifted out of DSR 228, and also receives a signal TDI corresponding to external data received by PLD 200 (e.g., received by a JTAG controller implemented by configuration logic 202). As shown, configuration logic 202 may selectively control whether signal DSR OUT or signal TDI is provided to logic 216.

Also during runtime operation of PLD 200, data signals corresponding to data values read from non-volatile memory array 204 may be provided from sense amplifiers 218 to DSR 228. DSR 228 may also provide data to be programmed into volatile memory array 230, or receive data read from volatile memory array 230.

During testing of PLD 200, means such as DSR 228 may be used to test volatile memory array 230. For example, test data values may be shifted into DSR 228 and programmed into volatile memory array 230. Data stored by volatile memory array 230 may be provided to DSR 228 which shifts the stored data to appropriate testing logic to determine whether the stored data corresponds to the original test data values programmed into volatile memory array 230.

Also during testing of PLD 200, means such as configuration logic 202, memory controller 212, sense amplifiers 218, test circuit 238, reference voltage signal REF, a test signal MT BE, a first pass/fail signal P/F1, and/or a second pass/fail signal P/F2 may be used to test non-volatile memory array 204. For example, means such as memory controller 212, sense amplifiers 218, and/or reference voltage signal REF may be used for reading data values stored by non-volatile memory array 204. Means such as memory controller 212 and/or sense amplifiers 218 may be used for providing a plurality of data signals corresponding to the data values stored by non-volatile memory array 204. Means such as memory controller 212 and/or a plurality of exclusive-or (XOR) gates 220 may be used for comparing the data signals with test signal MT BE. Means such as memory controller 212 may be used for providing first pass/fail signal P/F1 in response to the comparing. Means such as a plurality of transistors 222, a transistor 224, a node 240, and/or a signal MFG MT may be used for providing second pass/fail signal P/F2 in response to the comparing.

Test data values may be provided by memory controller 212 to non-volatile memory array 204 and programmed into non-volatile memory array 204. In this regard, a bulk program operation and/or a margin bulk program operation may be performed on non-volatile memory array 204 during which a signal MFG BP is set to a logic high value. As a result, logic 216 (e.g., implemented in one embodiment as a NOR gate) may provide logic low data values to memory controller 212 to be programmed into non-volatile memory array 204, and effectively bypass data corresponding to signal DSR OUT or signal TDI received from multiplexer 226.

During bulk program and bulk erase testing of PLD 200, data values stored by non-volatile memory array 204 may be read by memory controller 212 (as indicated by a signal DATA BITS) in a bit-by-bit fashion to verify whether a bulk program or bulk erase operation is successful. In this regard, memory controller 212 provides first pass/fail signal P/F1 to configuration logic 202 to indicate whether the bulk program or bulk erase operation is successful.

During margin bulk program and margin bulk erase testing of PLD 200, data signals corresponding to data values read from non-volatile memory array 204 may be provided from sense amplifiers 218 to test circuit 238. In one embodiment, test circuit 238 includes XOR gates 220 coupled to transistors 222. However, it will be appreciated that other logic may be used in different embodiments.

In one embodiment, test circuit 238 may be implemented as part of memory controller 212.

Each of XOR gates 220 receives a data signal corresponding to data read from non-volatile memory array 204 by a corresponding one of sense amplifiers 218. In addition, each of XOR gates 220 receives test signal MT BE and compares test signal MT BE with the corresponding received data signal. Accordingly, each of XOR gates 220 will provide a logic low value to a corresponding one of transistors 222 if data read by a corresponding one of sense amplifiers 218 matches the logic value of test signal MT BE, and will provide a logic high value in all other cases. Accordingly, transistors 222 will remain turned off for matching logic values received by XOR gates 220, and will turn on for non-matching logic values.

As also shown in FIG. 2, transistors 222 and transistor 224 are coupled together at node 240 that provides second pass/fail signal P/F2 (e.g., shown as an inverted signal in FIG. 2) to configuration logic 202. During margin testing of non-volatile memory array 204, transistor 224 may be turned on in response to signal MFG MT (e.g., shown as an inverted signal in FIG. 2). Accordingly, the voltage of node 240 may be selectively adjusted in response to the switching of transistors 222. As a result, node 240 will be pulled to a logic high value while all of transistors 222 remain turned off, and will be pulled to a logic low value if any of transistors 222 turn on.

Accordingly, it will be appreciated that second pass/fail signal P/F2 will, when inverted as shown in FIG. 2, exhibit a logic high value if all data values read by sense amplifiers 218 match test signal MT BE, and will exhibit a logic low value if any data values read by sense amplifiers 218 do not match test signal MT BE. As a result, non-volatile memory array 204 may be programmed or erased with test data values (e.g., logic low data values provided by logic 216 or logic high data values corresponding to erased memory cells), and these test data values may be compared by test circuit 238 without the use of DSR 228. DSR 228 may therefore be used as another test circuit to simultaneously test (e.g., concurrently, during, or otherwise overlapping in time) volatile memory array 230 while non-volatile memory array 204 is tested using test circuit 238.

Figure 3:
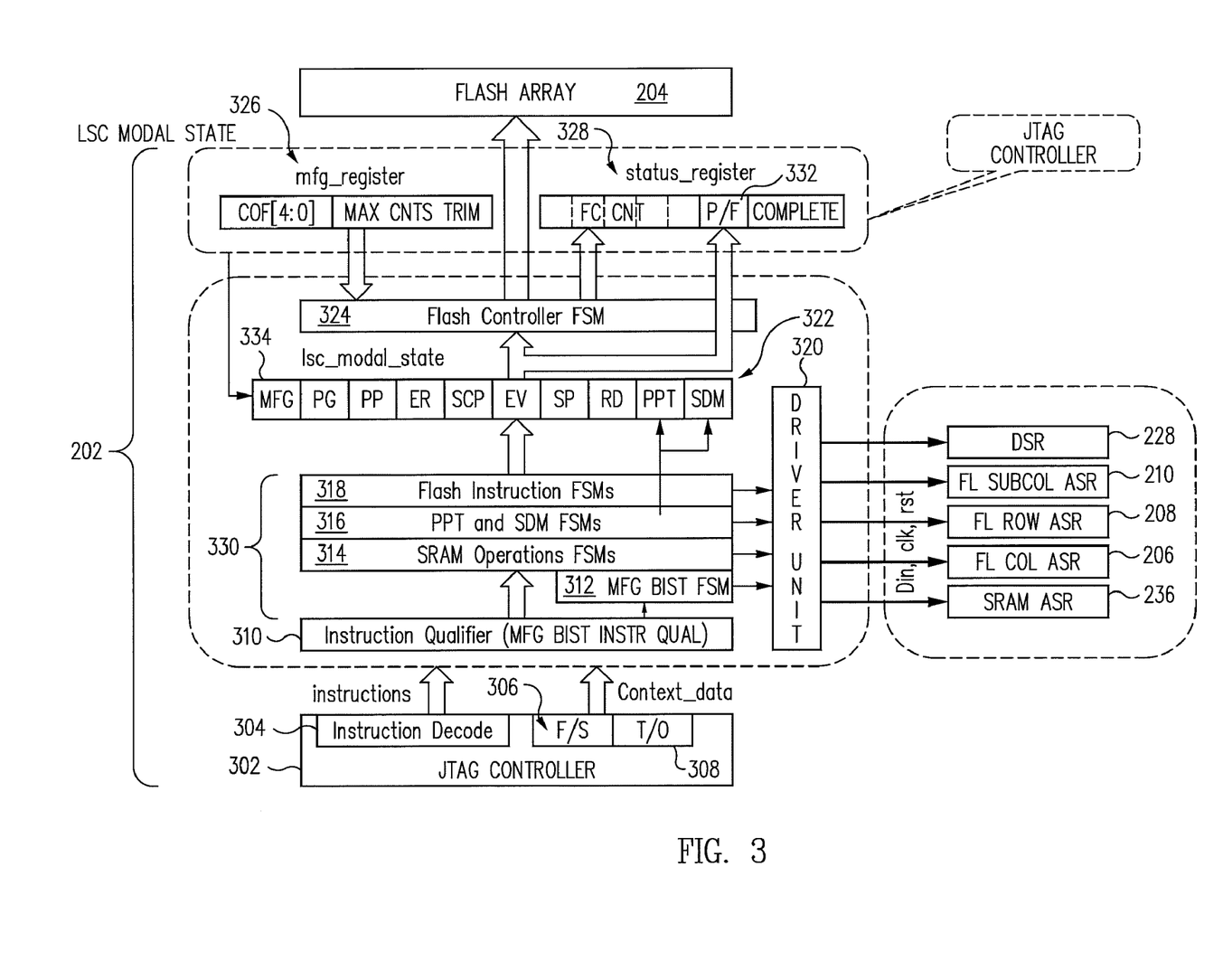
FIG. 3 illustrates a block diagram of configuration logic of a PLD in accordance with an embodiment of the invention.

FIG. 3 illustrates a block diagram of configuration logic 202 of FIG. 2 in accordance with an embodiment of the invention. As shown, configuration logic 202 includes JTAG controller logic 302 that may be used, for example, to support operation of a JTAG port such as configuration port 112 of PLD 100. In particular, JTAG controller logic 302 includes instruction decode logic 304 to decode incoming instructions received through configuration port 112. JTAG controller logic 304 also includes a context register 306 used to identify whether an instruction is intended to operate on non-volatile memory array 204 or volatile memory array 230. JTAG controller logic 304 further includes transparent/offline bits 308 to identify whether the operation specified by the instruction is transparent or offline. JTAG controller logic 302 provides instructions and data to instruction qualifier logic 310 that may be used to perform a security check of the instructions to determine whether they may be executed by configuration logic 202.

Configuration logic 202 also includes a plurality of finite state machines (FSMs) 330 which may operate in response to instructions received from JTAG controller logic 302 or in response to other FSMs 330 to provide signals through a driver unit 320 to various components previously described in FIG. 2 to control the operation of non-volatile memory array 204 and volatile memory array 230.

Configuration logic 202 includes a built in self test (BIST) BIST FSM 312 (labeled "MFG BIST FSM") to perform a built in self test of non-volatile memory array 204. For example, BIST FSM 312 may be implemented to perform bulk erase, bulk program, margin bulk program, and/or margin bulk erase tests on non-volatile memory array 204. SRAM operations FSMs 314 control the operation of volatile memory array 230. Post power up test (PPT) and self download mode (SDM) FSMs 316 control power up testing of the PLD and the downloading of data (e.g., configuration data) from non-volatile memory (e.g., non-volatile memory array 204) into configuration memory (e.g., volatile memory array 230) of PLD 200 upon power up. Flash instruction FSMs 318 provide control signals to a flash controller FSM 324 to control the operation of non-volatile memory array 204.

Configuration logic 202 also includes an operation status register 322 that includes a plurality of bit fields that may be set by FSMs 330 of configuration logic 202 during operations performed on non-volatile memory array 204. In response to the various bit fields set in operation status register 322, flash controller FSM 324 controls non-volatile memory array 204. In particular, operation status register 322 includes a manufacturing bit field 334 (labeled "MFG") that includes a margin bulk program test bit and a margin bulk erase test bit which may be set to selectively enable or disable various margin tests to be performed on non-volatile memory array 204 as further described herein. Manufacturing bit field 334 also includes a continue-on-fail bit which, when set, causes a built in self test process to continue operating if a failure is detected during the built in self test process.

As shown, operation status register 322 includes additional bit fields identified in Table 1 below which may be used to provide relevant information concerning the status of FSMs 330, operations performed by FSMs 330, and failures detected during the operation of FSMs 330.

TABLE 1

| Bit Fields | Operations Performed by FSMs |
| --- | --- |
| MFG | manufacture built in self test; enable/disable margin bulk program test; enable/disable margin bulk erase test; continue-on-fail |
| PG | programming |

TABLE 1-continued

| Bit Fields | Operations Performed by FSMs |
|---|---|
| PP | pre-programming |
| ER | erase |
| SCP | self-convergence programming |
| EV | erase verify |
| SP | soft programming |
| RD | read |
| PPT | post power up test |
| SDM | self-download mode |

Configuration logic 202 also includes a manufacturing status register 326 (labeled "mfg_register") used to hold counts of various operations controlled by FSMs 330. In this regard, FSMs 330 may selectively interrupt their associated processes if, for example, an operation has been repeated many times without success as indicated by one or more counts maintained by manufacturing status register 326. Manufacturing status register 326 includes additional bits to specify bandgap reference currents, pump voltages, and read reference voltages to be used in performing the various operations of a built in self test process. Manufacturing status register 326 may also include additional bits used to select a particular non-volatile memory array 204 from a plurality of other non-volatile memory arrays that may be included in PLD 200.

Configuration logic 202 also includes a testing status register 328 (labeled "status_register") used to hold a pass/fail (P/F) bit 332 set in response to first or second pass/fail signals P/F1 or P/F2 of FIG. 2 previously described herein.

Figure 4:
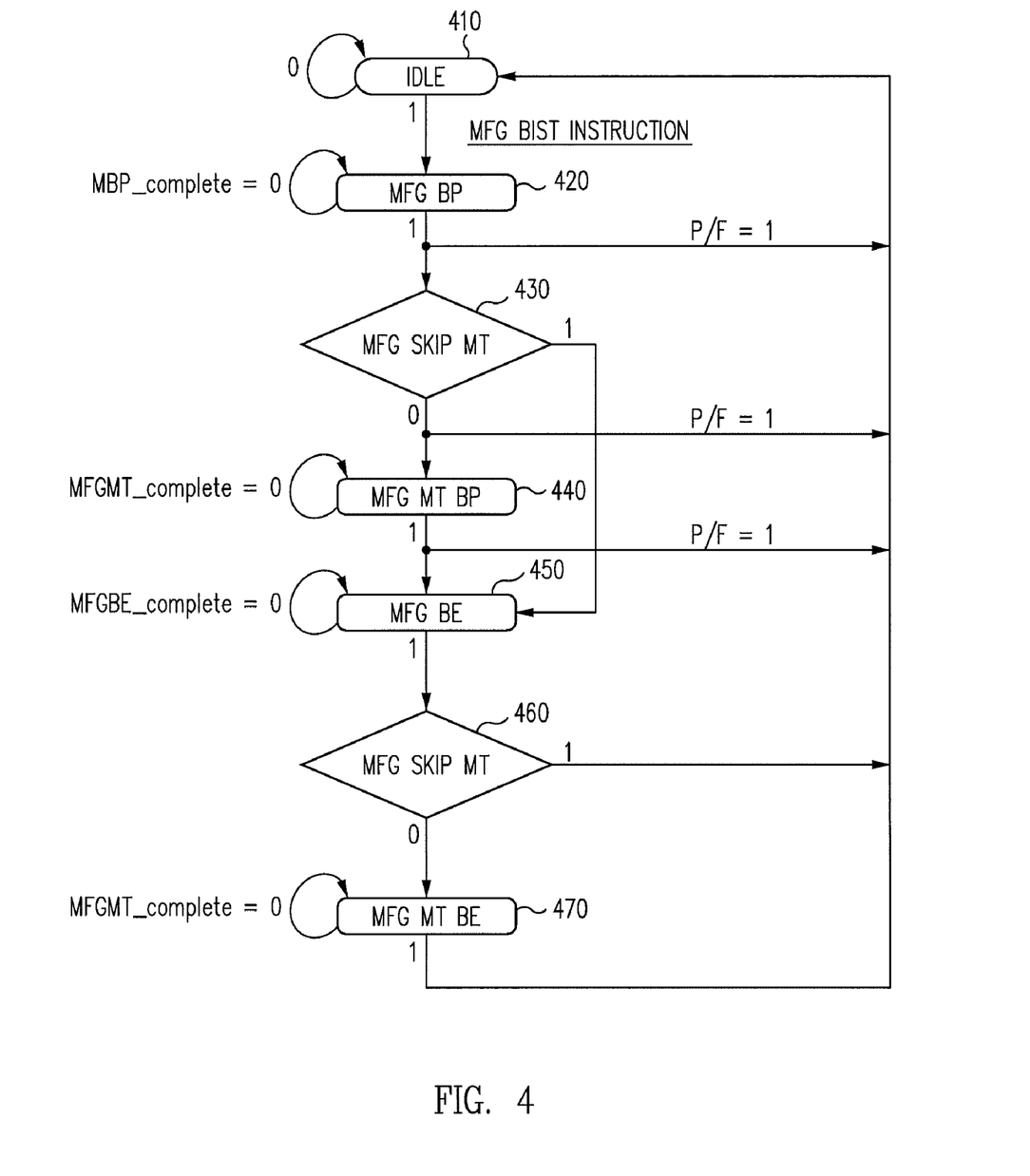
FIG. 4 illustrates a process of performing a built in self test of a memory array in accordance with an embodiment of the invention.

FIG. 4 illustrates a process of performing a built in self test of a memory array in accordance with an embodiment of the invention. In one embodiment, the process of FIG. 4 may be performed by built in self test FSM 312 of configuration logic 202.

In initial step 410, BIST FSM 312 waits in an idle state until configuration logic 202 receives an instruction to perform a built in self test of non-volatile memory array 204. For example, in one embodiment, configuration logic 202 may receive the instruction through a JTAG port. When such an instruction is received, the process continues to step 420.

In one embodiment, configuration logic 202 may be implemented to permit performance of a built in self test process only during manufacturing-related testing of PLD 200 (e.g., in a manufacture mode) and not during runtime. For example, in one embodiment, a built in self test process may be performed in response to a built in self test instruction when an appropriate manufacturing key is received by configuration logic 202. Instruction qualifier logic 310 may disable execution of built in self test instructions during runtime or when any security features such as security bits, one time programming (OTP), encryption, password protection, or other security measures are currently enabled in PLD 200. For example, in one embodiment, such security features may be enabled through the programming of a predetermined data pattern into non-volatile memory array 204, or when two or more data values not matching bulk-programmed, bulk-erased or checker-board patterns have been programmed into non-volatile memory array 204.

In step 420, BIST FSM 312 initiates a bulk program operation on non-volatile memory array 204. For example, in one embodiment, BIST FSM 312 may provide a bulk program instruction to one of flash instruction FSMs 318 to perform a bulk program operation on non-volatile memory array 204. BIST FSM 312 may also set signal MFG BP of FIG. 2 to a logic high value. As a result, logic low values will be provided from logic 216 to memory controller 212 for programming into non-volatile memory array 204. Configuration logic 202 may provide appropriate control signals to column ASR 206 and row ASR 208 to program non-volatile memory array 204 with logic low values. In one embodiment, data values programmed during the bulk program operation of step 420 may be read by memory controller 212 in a bit-by-bit fashion (e.g., through signal DATA BITS) to determine whether the bulk program operation is successful.

If the bulk program operation of step 420 is successful, then P/F bit 332 will be set (for example, set by first pass/fail signal P/F1) to a logic high value. In this case, the process continues to step 430. Otherwise, if the bulk program operation of step 420 is unsuccessful, then P/F bit 332 will be set (for example, set by first pass/fail signal P/F1) to a logic low value, and the process returns to step 410.

During the process of FIG. 4, if P/F bit 332 is set to indicate a failure, the process will generally return to step 410 as described herein. However, if the continue-on-fail bit of manufacturing bit field 334 is optionally set, P/F bit 332 will not cause the process of FIG. 4 to return to step 410. In the presently described embodiment, it will be assumed that the continue-on-fail bit of manufacturing bit field 334 has not been set. Accordingly, in one embodiment, if P/F bit 332 is set to indicate a failure, the process returns to step 410. Optionally, in another embodiment, if P/F bit 332 is set to indicate a failure during the process of FIG. 4, the failing address of non-volatile memory array 204 may be shifted out using an appropriate manufacture address shift instruction for debugging purposes.

In step 430, BIST FSM 312 determines whether to perform or skip a margin bulk program operation on non-volatile memory array 204 based on whether a margin bulk program test bit of manufacturing bit field 334 has been set to enable or disable margin bulk program of non-volatile memory array 204. If the margin bulk program test bit has not been set, and P/F bit 332 has not been set, then the process continues to step 440. If the margin bulk program test bit has been set, then the process skips to step 450. If P/F bit 332 has been set, then the process returns to step 410.

In step 440, BIST FSM 312 initiates a margin bulk program operation on non-volatile memory array 204. For example, in one embodiment, BIST FSM 312 may provide a margin bulk program instruction to one of flash instruction FSMs 318 to perform a margin bulk program operation on non-volatile memory array 204.

During step 440, as similarly described in step 420, BIST FSM 312 may set signal MFG BP of FIG. 2 to a logic high value to provide logic low values from logic 216 to memory controller 212 for programming into non-volatile memory array 204. Configuration logic 202 may provide appropriate control signals to column ASR 206 and row ASR 208 to program non-volatile memory array 204 with logic low values.

Also during step 440, the programmed data values of non-volatile memory array 204 are read by sense amplifiers 218 and provided to test circuit 238 to determine whether non-volatile memory array 204 has been successfully programmed. As previously described, test circuit 238 may be used to determine whether all data values read by sense amplifiers 218 are set to logic values that match the logic value of test signal MT BE. Accordingly, during step 420, test signal MT BE may be set to a logic low value which corresponds to the logic value expected to be programmed into the data values of non-volatile memory array 204 if the margin bulk program operation of step 420 is successful.

If XOR gates 220 all receive logic low values from sense amplifiers 218, then transistors 222 will remain turned off, node 240 will be pulled to a logic high value, and P/F bit 332 of testing status register 328 will be set to a logic low value in response to second pass/fail signal P/F2 provided from node 240 to indicate that the margin bulk program operation of step 440 was successful. In this case, the process continues to step 450.

If any of XOR gates 220 receive a logic low value from sense amplifiers 218, then P/F bit 332 of testing status register 328 will be set to a logic high value in response to second pass/fail signal P/F2 provided from node 240 to indicate that the margin bulk program operation of step 440 was unsuccessful.

During the margin bulk program operation of step 440, sense amplifiers 218 compare data voltages read from non-volatile memory array 204 with various reference voltages. This may be repeated for various reference voltages as may be desired in particular implementations. Appropriate reference voltages may be provided internally by PLD 200 or, in another embodiment, received by PLD 200 from an external source through an appropriate input pad. For example, in one embodiment, reference voltages of reference voltage signal REF may be used.

If the margin bulk program operation of step 440 is successful, then the process continues to step 450. Otherwise, P/F bit 332 is set in response to second pass/fail signal P/F2, and the process returns to step 410.

In step 450, BIST FSM 312 initiates a bulk erase operation on non-volatile memory array 204. For example, in one embodiment, BIST FSM 312 may provide a bulk erase instruction to one of flash instruction FSMs 318 to perform a bulk erase operation on non-volatile memory array 204. In one embodiment, data values of non-volatile memory array 204 may be read by memory controller 212 in a bit-by-bit fashion (e.g., through signal DATA BITS) to determine whether the bulk erase operation is successful.

If the bulk erase operation of step 450 is successful, then the process continues to step 460. Otherwise, memory controller 212 sets P/F bit 332 through first pass/fail signal P/F1, and the process returns to step 410.

In step 460, BIST FSM 312 determines whether to perform or skip a margin bulk erase test on non-volatile memory array 204 based on whether a margin bulk erase test bit of manufacturing bit field 334 has been set to enable or disable the margin bulk erase test. If the margin bulk erase test bit has not been set, then the process continues to step 470. If the margin bulk erase test bit has been set, then the process returns to step 410.

In step 470, BIST FSM 312 initiates a margin bulk erase operation on non-volatile memory array 204. For example, in one embodiment, BIST FSM 312 may provide a margin bulk erase instruction to one of flash instruction FSMs 318 to perform a margin bulk erase operation on non-volatile memory array 204.

During step 470, data values of non-volatile memory array 204 are read by sense amplifiers 218 and provided to test circuit 238 to determine whether non-volatile memory array 204 has been successfully erased. Accordingly, during step 470, test signal MT BE may be set to a logic high value which corresponds to the logic values expected to be programmed into the data values of non-volatile memory array 204 if the margin bulk erase operation of step 470 is successful.

If XOR gates 220 all receive logic high values from sense amplifiers 218, then transistors 222 will remain turned off, node 240 will be pulled to a logic high value, and P/F bit 332 of testing status register 328 will be set to a logic low value in response to second pass/fail signal P/F2 provided from node 240 to indicate that the margin bulk erase operation of step 470 was successful.

However, if any of XOR gates 220 receive a logic low value from sense amplifiers 218, then P/F bit 332 of testing status register 328 will be set to a logic high value in response to second pass/fail signal P/F2 to indicate that the margin bulk erase operation of step 470 was unsuccessful.

During the margin bulk erase operation of step 470, sense amplifiers 218 compare data voltages read from non-volatile memory array 204 with various reference voltages. This may be repeated for various reference voltages as may be desired in particular implementations. As similarly described in step 440, appropriate reference voltages may be provided internally by PLD 200 (e.g., under the control of configuration logic 202) or, in another embodiment, received by PLD 200 from an external source through an appropriate input pad. For example, in one embodiment, reference voltages of reference voltage signal REF may be used. After the margin bulk erase operation of step 470 is completed, the process returns to step 410.

Following the process of FIG. 4, BIST FSM 312 will have completed a built in self test of non-volatile memory array 204. In this regard, it will be appreciated that test data values to be programmed into non-volatile memory array 204 during margin testing may be provided without the use of DSR 228, and that successful and unsuccessful margin test programming and erasing of non-volatile memory array 204 may be determined by test circuit 238 and configuration logic 202 without the use of DSR 228. In particular, the data values read from non-volatile memory array 204 during margin testing need not be shifted into DSR 228 over many clock cycles, thereby significantly reducing testing time.

In addition, while non-volatile memory array 204 is tested using test circuit 238, DSR 228 remains available for use by PLD 200 for performing other operations such as, for example, programming, erasing, and reading operations to test volatile memory array 230. In one embodiment, data to be programmed into volatile memory array 230 may be shifted into DSR 228, and data read from volatile memory array 230 may be shifted out of DSR 228 without affecting the simultaneous testing of non-volatile memory array 204. Therefore, the total testing time for memory arrays of PLD 200 can be significantly reduced.

Although various embodiments have been described using a single non-volatile memory array and a single volatile memory array, any desired combination or number of non-volatile and/or volatile memory arrays may be tested using the techniques described herein. Similarly, redundant memory arrays or portions thereof may also be tested in accordance with the processes and circuitry described herein.

Embodiments described above illustrate but do not limit the invention. It should also be understood that numerous modifications and variations are possible in accordance with the principles of the present invention. Accordingly, the scope of the invention is defined only by the following claims.

We claim:

1. A programmable logic device (PLD) comprising:
   a first memory array;
   a plurality of sense amplifiers adapted to read a plurality of data values stored by the first memory array and provide a plurality of data signals corresponding to the data values;
   a test circuit adapted to test the first memory array, wherein the test circuit is coupled with the sense amplifiers and adapted to compare the data signals with a test signal to provide a pass/fail signal;

a second memory array; and a data shift register adapted to test the second memory arrays, wherein the test circuit and the data shift register are adapted to simultaneously test the first and second memory arrays, respectively.

2. The PLD of claim 1, wherein the test circuit comprises:

a plurality of logic gates adapted to compare the data signals with the test signal; and a plurality of transistors adapted to selectively adjust a node voltage in response to the logic gates to provide the pass/fail signal.

3. The PLD of claim 1, further comprising a configuration logic memory block comprising a finite state machine adapted to initiate a test of the first memory array using the test circuit in response to an instruction received by the PLD.

4. The PLD of claim 1, further comprising a configuration logic memory block adapted to initiate a test of the first memory array using the test circuit, wherein the test comprises at least one of a bulk program test, a bulk erase test, a margin bulk program test, and a margin bulk erase test.

5. The PLD of claim 1, wherein the sense amplifiers are coupled to the data shift register to provide the data signals to the data shift register during runtime operation of the PLD.

6. The PLD of claim 1, wherein the data shift register is adapted to provide the data values to the first memory array during runtime operation of the PLD.

7. The PLD of claim 1, wherein the first memory array is a non-volatile memory array and the second memory array is a volatile memory array.

8. The PLD of claim 1, wherein the first memory array is flash memory array and the second memory array is a static random access memory (SRAM) array.

9. A method comprising:

performing a first test on a first memory array of a programmable logic device (PLD), wherein the first test comprises:

reading a plurality of data values stored by the first memory array, providing a plurality of data signals corresponding to the data values, comparing the data signals with a test signal, and providing a pass/fail signal in response to the comparing; and performing a second test on a second memory array of the PLD using a data shift register of the PLD during the first test.

10. The method of claim 9, wherein the first test is a margin bulk program test further comprising programming the first memory array with the data values before the reading, wherein the reading comprises comparing the data values with a plurality of reference voltages.

11. The method of claim 9, wherein the first test is a margin bulk erase test further comprising erasing the first memory array before the reading, wherein the reading comprises comparing the data values with a plurality of reference voltages.

12. The method of claim 9, further comprising performing a third test on the first memory array during the second test.

13. The method of claim 9, wherein the providing a pass/fail signal comprises selectively adjusting a node voltage in response to the comparing.

14. The method of claim 9, wherein the method is performed in response to an instruction received by the PLD.

15. The method of claim 9, wherein the first test is performed by a finite state machine.

16. The method of claim 9, wherein the first memory array is a non-volatile memory array and the second memory array is a volatile memory array.

17. An integrated circuit comprising:

a first memory array;

a built in self test (BIST) test circuit adapted to test the first memory array;

a second memory array; and a data shift register adapted to test the second memory array simultaneously with the built in self test test circuit testing the first memory array.

18. The integrated circuit of claim 17, wherein the first memory array is a non volatile memory array and the second memory array is a volatile memory array.

* * * * *

UNITED STATES PATENT AND TRADEMARK OFFICE
CERTIFICATE OF CORRECTION

| | | |
|---|---|---|
| PATENT NO. | : 7,630,259 B1 | Page 1 of 1 |
| APPLICATION NO. | : 11/959329 | |
| DATED | : December 8, 2009 | |
| INVENTOR(S) | : Wei Han et al. | |

It is certified that error appears in the above-identified patent and that said Letters Patent is hereby corrected as shown below:

Column 11, line 3, change "arrays" to --array--.

Column 12, line 35, change "test test" to --test--.

Signed and Sealed this
Seventeenth Day of January, 2012

David J. Kappos
*Director of the United States Patent and Trademark Office*